United States Patent [19]

Hershel

[11] Patent Number: 4,681,414
[45] Date of Patent: Jul. 21, 1987

[54] CONDENSER SYSTEM

[76] Inventor: Ronald S. Hershel, 4828 Springhill Rd., Albany, Oreg. 97321

[21] Appl. No.: 618,056

[22] Filed: Jun. 6, 1984

Related U.S. Application Data

[63] Continuation-in-part of Ser. No. 502,486, Jun. 9, 1983, abandoned.

[51] Int. Cl.$^4$ ............................................. G03B 21/00
[52] U.S. Cl. .................................... 353/102; 353/122; 353/99
[58] Field of Search ................. 353/102, 121, 122, 98, 353/99; 350/96.24, 96.27, 96.25, 442, 443, 199; 355/51; 362/32, 268, 297, 299; 250/227

[56] References Cited

U.S. PATENT DOCUMENTS

| | | | |
|---|---|---|---|
| 3,104,324 | 9/1963 | Rabinow | 350/96.25 X |
| 3,411,010 | 11/1968 | Genahr et al. | 350/96.24 X |
| 3,500,054 | 3/1970 | LaSalle et al. | 350/96.24 X |
| 3,772,506 | 11/1973 | Junginger | 362/32 |
| 3,963,353 | 6/1976 | Hemstreet | 356/399 X |
| 4,111,538 | 9/1978 | Sheridon | 353/99 X |
| 4,241,390 | 12/1980 | Markle et al. | 353/99 X |
| 4,458,302 | 7/1984 | Shiba et al. | 350/505 X |
| 4,530,565 | 7/1985 | Markle | 350/96.25 X |

Primary Examiner—Harry N. Haroian
Attorney, Agent, or Firm—Kendrick, Netter & Bennett

[57] ABSTRACT

A condenser useful in ring-field optics includes a device for homogenizing light with little or no change in light cone angle, or in the polar distribution of light linked to a device for channeling the light emerging from the homogenizing device equally, but with variable intensity, into an arc of light spots having a predetermined intensity, radius, width and direction, a device for magnifying the width of the arc of light spots, and for reducing proportionately its cone angle in the direction of its width while converting its shape from elliptical to circular with substantially symmetrical distribution of light, a device for transferring the circular arc of light spots to, and focusing the arc at an image plane while homogenizing the light along the length of the arc, and a device for easily changing arc radius. This condenser may include an autocollimator for aligning the condenser elements with one another, and with the projection optics of a photolithographic device.

45 Claims, 3 Drawing Figures

CONDENSER SYSTEM

This application is a continuation-in-part of U.S. patent application Ser. No. 502,486, filed June 9, 1983, now abandoned, in the U.S. Patent and Trademark Office, and entitled, "Condenser System." By this reference, we incorporate the entire disclosure of that application in this application.

This invention relates to a condenser system useful in projection aligners such as the Perkin-Elmer Micralign 100-300 series.

Scanning projection aligners have these requirements:

(1) Mask illumination must be confined with thin annular arcs subtending about 90° with the radius of the arc dictated by the projection optics of the aligner (for example, the Micralign series requires a nominal 59.7 millimeter arc radius);

(2) The annular arc image should have a width less than or equal to one millimeter for optimum performance, and should be in focus at all wavelengths;

(3) The intensity distribution along the length of the arc should achieve a constant exposure at the image plane;

(4) The intensity distribution along the arc should remain fixed despite aging of or replacement of the light source;

(5) The condenser light output should remain constant during scanning of a single wafer, and during scanning of several different wafers;

(6) The spectral content of the arc should remain substantially constant despite aging of or replacement of the lamp;

(7) The condenser's aperture should be between f/4.2 and f/6 for optimum performance with f/3 projection aligners;

(8) The arc image should be telecentric such that the condenser aperture is imaged into the entrance pupil of the projection optics of the aligner;

(9) Condenser adjustments should include and permit focusing and positioning of the arc including control of arc radius; and

(10) UV and resist-sensitive portions of the output spectrum should be blocked during alignment of wafer to mask to prevent wafer exposure.

Other requirements include compatibility with set-up tooling, either external or internal to the condenser, for center of curvature, parallelism, and focused wedge tests routinely required during maintenance of the aligner.

Existing condenser designs for projection aligners such as those in the Micralign 100-300 series have many drawbacks. For example, these designs have low optical efficiency. Typically, they employ lamps having a rating of between 1,000 and 2,000 watts to produce an arc of sufficent intensity to achieve acceptable wafer exposure times in mass production. Such lamps generate substantial amounts of heat, which must be removed or mitigated.

Due to the condenser requirements, over 99% of the light output of these lamps is unusable. Aging of lamps and replacement of these lamps affect the uniformity of intensity along the arc, requiring frequent condenser adjustments. Capillary arc lamps are generally operated in AC mode resulting in a 120 Hz output, causing variations in exposure during high-speed wafer scanning. At the low end of the light spectrum, around 365 nanometers, capillary arc lamps show significant spectral changes as the lamp ages. The radius of the arc cannot be adjusted to accommodate variations in the aligner optics using existing condenser designs. In present designs, IR and visible light are not removed from the light reaching the wafer, causing unnecessary heating of the mask, leading to magnification distortion of the projected image. The center of curvature tooling in existing condenser designs is cumbersome and imprecise when making axial lens adjustments.

Our new condenser overcomes the disadvantages of existing systems, and satisfies all the general requirements for high-speed wafer exposure in mass production. Our new condenser comprises means for focusing light onto an area of cross-section sufficiently small to enter means for homogenizing the focused light. The condenser also includes means for efficiently homogenizing focused light with substantially no change in the light cone angle and substantially no reflection losses of light. Light emerging from the homogenizing means passes to means for channeling the light equally, but with controlled, variable intensity, radius and width of light cone.

The channeling means is linked to means for magnifying the width of the arc of light spots, and for simultaneously converting the emitted cone angle from the arc in the direction of its width to an elliptical distribution to achieve a circular, symmetric light intensity in the entrance pupil of projection optics. The new condenser also includes means for transferring the circular arc of light spots to, and focusing the circular arc on an image plane, for homogenizing the light along the length of the arc to produce the desired intensity distribution along the arc length in the image plane, and for allowing an arc radius change with a single adjustment while maintaining the focus of the arc image.

In our new condenser, the preferred means for generating light is a compact arc lamp having a rating in the range of 100 to 200 watts. Because of the small size of the arc in relation to the light output, such lamps yield much higher efficiency than condenser designs using capillary arc lamps. In one embodiment of this new design, the size of the arc from such lamps is typically within the range of about 0.25 to about 0.5 millimeters in length.

For collecting and focusing light from the lamp, our new system preferably includes an elliptical reflector that collects in the range of about 80% to about 90% of the total light emitted from the lamp and produces an image in the range of about 4 to about 8 millimeters in diameter. Preferably, our condenser utilizes cold mirrors, filter wheels and other devices for preventing unwanted portions of the light spectrum from reaching the image plane. Such devices can remove up to 90% of the IR and visible light from the lamp output. During alignment, sufficient light at 546 and 580 nanometers is made available, however.

In preferred embodiments, our homogenizing means comprises a light pipe having a rectangular, square, or round cross-section. Such light pipes scramble the intensity distribution of the light entering the pipe while preserving the cone angle of the light. As an example of the uniformity achieved with such light pipes, a seven-inch-long solid quartz light pipe with a square cross-section of 0.25-inch diameter improves the output uniformity of light output by a factor of about 40 for an entrance cone of f/2.5.

Preferred embodiments of our new condenser direct light emerging from the light pipe into a bundle of optical fibers, which are the preferred means for channeling the light emerging from the pipe equally, but with controlled position, into an arc of light spots. In one embodiment, the fiber-optic bundle includes about 99 quartz fibers, each having a core diameter of 0.6 millimeters. The input face of such a bundle is about 0.25 inch square. Efficient fiber packing produces a good energy transfer from a light pipe to a fiber-optic bundle in the range of about 65% to about 75%. The bending radius of the fibers is approximately the same for all fibers, contributing to a more constant angular distribution of light emerging from each fiber. The fibers are approximately the same length, further improving the uniformity in light emerging from each fiber. Properly assembled and joined to the light pipe, the fiber-optic bundle in preferred embodiments maintains variations in the uniformity of light emerging from the fibers to about ±5% or less. Light distribution along the arc of light spots emerging from the fibers is a function of the spacing between the fiber ends, and decreases linearly with increasing fiber spacing.

At the output end of the fiber-optic bundle, the fibers form a section of a cone concentric with the optical axis of the condenser. The angle of this cone to the optical axis is about 48.2%. The fiber ends are polished to form a cylindrical segment that is concentric with the optical axis of the condenser. In one embodiment, the fiber ends are cut to form elliptical faces of identical size and shape on a radius of about 40 milimeters. In another embodiment, the fiber ends are cut at right angles to the longitudinal axis of the fibers.

In preferred embodiments, the means for magnifying the width of the arc, for reducing proportionately the light cone angle in the direction of its width, and for producing a circularly symmetrical illumination pattern at the aperture of the condenser, is a toroidal lens comprising a hemi-cylindrical lens with its plano side bent to a radius of about 40 millimeters.

The polished ends of the fibers can be joined, by cementing or otherwise, to the toroidal lens at its center of curvature, where the fibers have been cut to form elliptical faces of identical size and shape. Where the fibers are cut at right angles to the longitudinal axes of the fibers to form their output ends, the fibers are attached to the toroidal lens on a lens surface which is parallel to the surface of the fiber ends. Cementing the fiber ends to the toroidal lens protects the ends from contamination, reduces scatter from polishing imperfections in the fiber ends, and generally improves uniformity and transmission of light to the condenser aperture.

The toroidal lens magnifies the light emerging from the fibers in only one direction, namely the width of the arc image, while reducing proportionately the cone angle of the arc in the direction of its width. The circular cone of light exiting the fiber ends emerges from the toroidal lens as an elliptical cone which produces a circularly symmetric illumination pattern in the condenser aperture. This symmetric pattern at the aperture of the condenser insures highly uniform printing characteristics with maximum light throughput to the image plane.

Between the magnifying means and the means for transferring and focusing the arc of light spots at the image plane, in preferred embodiments, our system may include flat mirrors for changing the direction of the arc emerging from the toroidal lens, and optionally, aperture stops and filter wheels located at the condenser's aperture plane. The center of the aperture stop must be at the optical axis of the condenser and approximately at the sagittal focus of the means for relaying and focusing the arc at the image plane. Coincidently, the center of the aperture stop is also at the apex of the fiber optical axes. Accordingly, the optical axis of each fiber intersects the optical axis of the condenser at the center of the aperture. This configuration insures identical partial coherence in illumination along the arc.

In preferred embodiments, the means for transferring the arc of light spots to, and for focusing the arc at the image plane while blurring the light along the length of the arc, is a spherical relay mirror. To obtain a nominal arc radius of 59.7 millimeters where the fiber arc radius is about 40 millimeters, the spherical mirror should have a radius of about 146 millimeters. The focus of the arc image coincides with the tangential focus of the relay mirror, defined on a plane normal to the optical axis of the condenser passing through the center of curvature of the spherical relay mirror. The chief ray at each point along the arc image is normal to this plane, defining telecentricity in illumination.

The conjugate focal surface near the nominal position of the fiber arc can be approximated by a cylindrical segment concentric with the optical axis of the condenser. This approximation is valid where the chief rays on the aperture side of the spherical mirror subtend an angle of about 48.2° with the optical axis of the condenser. Accordingly, small axial displacements of the fiber arc change the radius of the arc image, but do not affect its tangential focus. For example, a one millimeter axial displacement of the fiber arc results in an approximate 0.7 millimeter change in arc radius.

Because conjugate focus distances are about equal in our condenser, spherical aberrations of the spherical relay mirror are small, resulting in high acuity at the edges of the arc image. Previous condensers required an aspheric relay mirror because conjugate distances were unequal.

In our condenser, the sagittal focal plane of the relay mirror is beyond the arc image, causing considerable blurring of the arc in the sagittal direction, i.e., along the arc. Accordingly, the intensity of the light emerging from the fibers is averaged at the image plane to produce a smooth distribution of light along the arc. The degree of smoothing increases with the size of the aperture. For an aperture having a size of f/4.2, the blur pattern extends over 10 to 12 fibers. Additional fibers are necessary beyond the specified arc lengths to avoid errors in illumination intensity near the ends of the arc image.

The toroidal lens does not affect image quality of the arc because the fiber ends are located at the center of curvature of the toroidal lens. The only effect of the toroidal lens is to magnify apparent size of the fiber ends by N, where N is the index of refraction of the toroidal lens. Accordingly, where N is 1.5, fibers having a diameter of 0.6 millimeters produce an arc with a width of 0.9 millimeters.

Our new condenser has several advantages not found in the prior art. The preferred condenser embodiment, utilizing optic fibers, a quartz light pipe, a 100-watt lamp and an elliptical reflector, collects about 25% to about 30% of lamp light in the spectral range of interest, and produces a 0.9 millimeter-wide arc image. With absorptive losses, the overall condenser efficiency is still at least about 20% with an equivalent aperture of f/4.2 to f/5.

Existing condenser designs using 1200-watt capillary arc lamps at an aperture of f/4.2 with a one millimeter arc width produce only 15% to 25% as much light on the condenser output as our new systems. Our condenser design achieves greater than 1% lamp power to light output conversion efficiencies in the range of 350–450 nanometers; existing condenser designs achieve less than 0.03% lamp power to light output conversion efficiency in the same spectral range. For example, in our system, with a total lamp output of about 8 watts in the spectral range of about 350 to about 450 nanometers, an estimated 0.8 to 1.5 watts of power is delivered to the output of the condenser.

Another outstanding advantage of our condenser design is that the measured distribution of energy along the projected arc images is held within ±2% of the required distribution, producing uniform exposure over a wafer at the image plane. Compensation of the geometrical scan properties by the projection aligner is programmed into the condenser design through fiber spacing in the fiber arc. Lamp alignment and lamp aging have substantially no effect on the uniformity of our arc image. By contrast, existing condenser designs using capillary arc lamps require a complex adjustment of a pre-slit to achieve the desired intensity profile in the arc. Our system has no pre-slit, and requires no slit adjustment to accommodate changes in the lamp output during its life.

Our new design permits adjustment of arc radius by simple axial displacement of the fiber arc bundle. The radius of the arc image can be changed typically by ±50 mils from a given value without refocusing. Existing condensers are not designed to easily change arc radius; our system has this fine tuning capacity resulting in ultimate resolution.

Our new condenser produces an arc that is sharply focused along its entire length and width regardless of aperture selection. The focus is changed with a single adjustment, which alters neither arc radius nor arc alignment. These features allow rapid focus adjustment to accommodate different mask thicknesses. As with arc radius, proper focus of arc image is desirable to obtain ultimate resolution.

Our new condenser can better be understood by reference to the accompanying drawings, in which.

Figure 1:
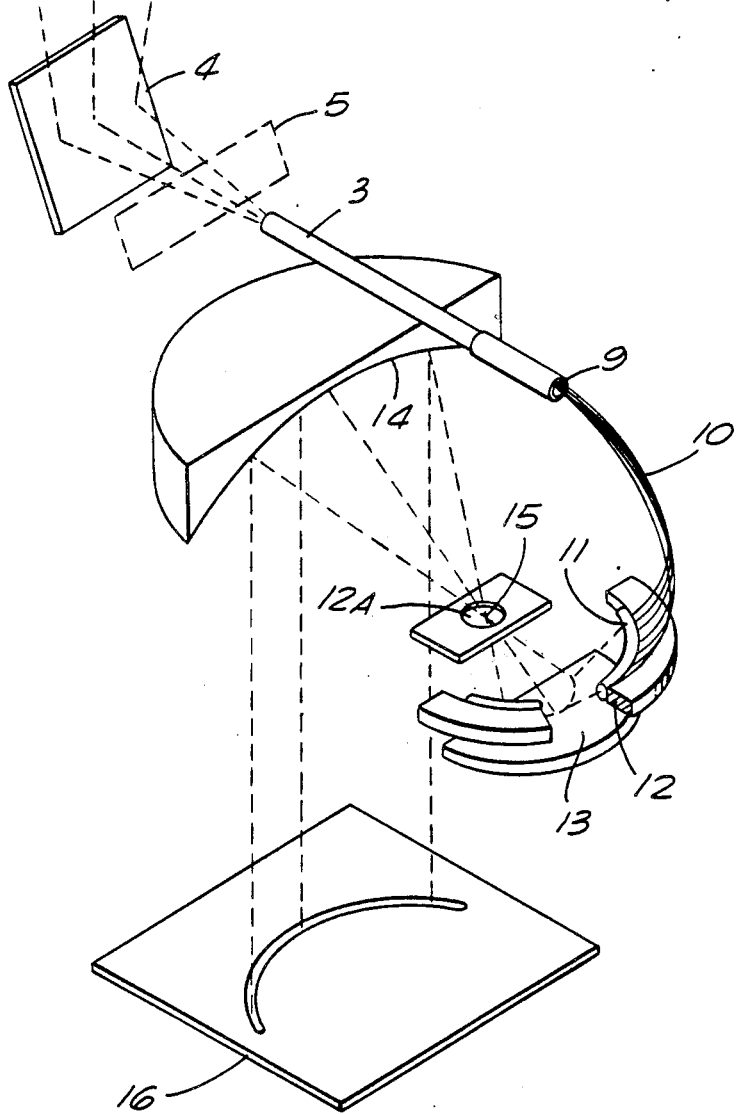
FIG. 1 illustrates the illuminator system of this invention.

In the drawings, light from a 100-watt compact mercury arc lamp 1 is collected with an elliptical reflector 2 and focused into quartz light pipe 3. Lamp 1 is preferably at, or is adjusted to be positioned at the focal point of reflector 2. Most of the IR and visible radiation in the light is removed upon reflection from cold mirror 4, which has dielectric coatings suitable for this purpose. Filter selector 5, placed between mold mirror 4 and light pipe 3, blocks UV radiation during alignment, provides a shutter, and attenuates light using neutral density filters when exposing high-speed resists. During wafer exposure, filter wheel 5 normally has a clear aperture.

Light passing through light pipe 3 undergoes total internal reflections, homogenizing the light and producing a uniform intensity distribution at exit face 9 of pipe 3. The input end of fiber-optic bundle 10 is cemented to exit face 9. Fiber-optic bundle 10 divides the light into an arc of light spots at bundle exit 12. The spacing between the fibers in bundle 10 determines the intensity distribution in the final arc image. The output ends of the fibers in bundle 10 are concentric with the optical axis of the condenser, and tilted away from the optical axis by 48.2°.

Toroidal lens 11, consisting of a glass rod ground and polished flat on one side with the radius of the curved side in the range of about 5 to about 10 millimeters, and curved to match the arc radius of the fibers, is cemented to the fiber ends. The fiber ends are polished parallel to the optical axis, forming a cylindrical surface. Light exiting toroidal lens 11 is directed to condenser aperture 12A by flat-fold mirror 13. The aperture is concentric with the optical axis of the condenser, and located at the sagittal focus of spherical relay mirror 14, whose center of curvature 15 lies on the optical axis of the condenser. The radius of spherical relay mirror 14 is selected to produce an arc image at the image plane 16 with a proper radius to match the ring-field of the projection optics. The inherent astigmatism of spherical relay mirror 14 produces an arc image that is sharply focused along the arc width, but severely defocused along the arc length. The resulting blurred arc image transforms the discrete output of the fiber bundle into a continuous light distribution along the arc image at the image plane.

In some embodiments of this new system, the light pipe has a rectangular or square cross-section, and comprises two or more pipe sections of identical cross-sectional dimensions. To join these sections together to form a continuous light pipe path, we can use one or more prisms as connectors. See FIG. 2 for an illustration.

Figure 2:
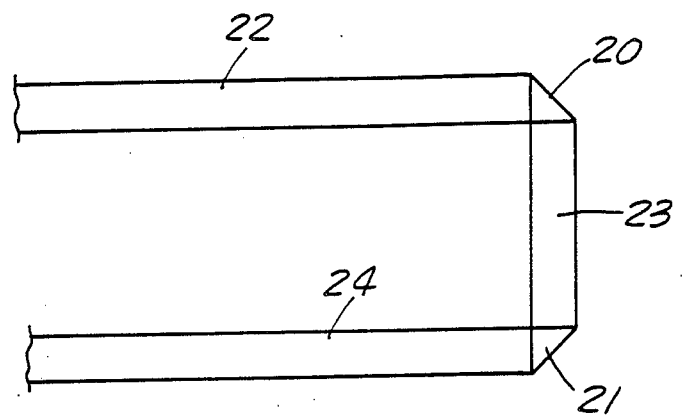
FIG. 2 illustrates means for bending the light pipe shown in FIG. 1 in two or more directions.

In FIG. 2, prisms 20 and 21 link light pipe sections 22, 23 and 24. These prisms change the direction of light passing through the light path without altering the directional cosine of the light rays.

To avoid light losses in the prisms, the cement interface between the entrance and exit faces of each prism and contiguous light pipe should have a low index of refraction. All five prism faces should be polished, and the faces of the prisms and adjoining light pipe sections should be accurately matched in length, width and flatness. The hypotenuse of the prism may require a coating to prevent light leakage through this surface.

For light to pass without losses and without change in angular distribution from light pipe 22 into prism 20, the angle of incidence of a light beam leaving light pipe 22 and entering prism 20 must be less than the critical angle at the prism/light pipe interface. For light to emerge from prism 20 and pass into light pipe 23, the angle of incidence of the light beam leaving the prism from the entrance face of light pipe 23 must be greater than the critical angle at the prism/light pipe interface. The critical angle of the prism is given by the arc cosine of the index of refraction of the cement divided by the index of refraction of the prism.

Where these conditions are fulfilled, a light beam leaving light pipe 22, entering prism 20, and reflecting from the hypoteneuse of prism 20 onto a path that would otherwise return the light beam to light pipe 22, will instead be reflected within prism 20 and enter pipe 23. The angle of the light beam entering prism 20 from light pipe 22 will be less than the critical angle; the light beam reflected from the hypoteneuse of prism 20 will have an angle of incidence on the vertical wall of prism 20 that is greater than the critical angle. In this way, the beam will be internally reflected within prism 20 and pass into light pipe 23 at an angle of incidence that is less than the critical angle.

Figure 3:
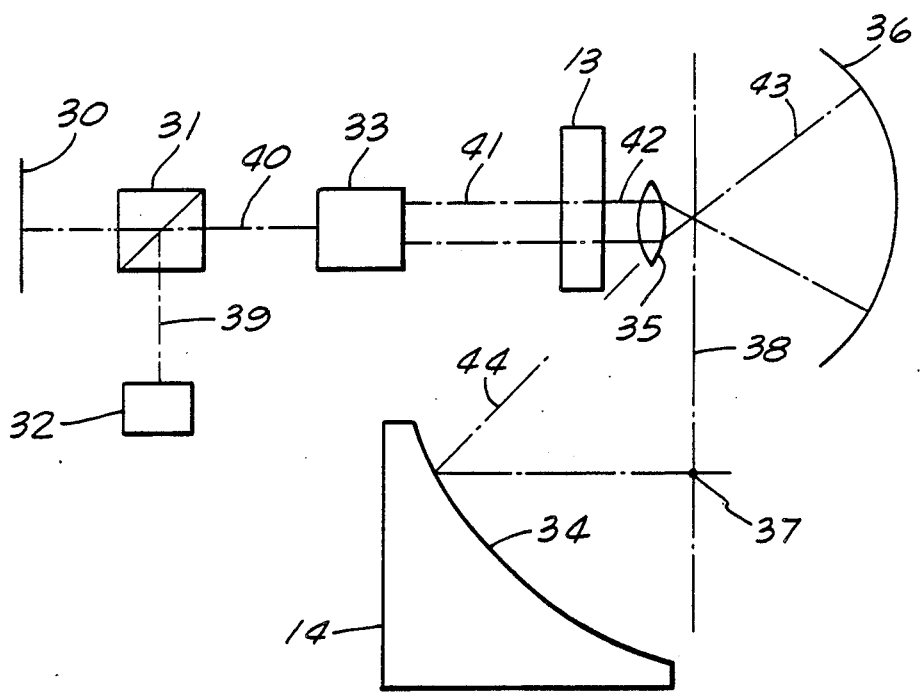
FIG. 3 illustrates a system for aligning a system as shown in FIG. 1 to the projection optics of a photolithographic device.

FIG. 3 illustrates a system for aligning elements of our illuminator system accurately and precisely, and for aligning the illuminator system to the projection optics in a photolithographic device such as a Perkin-Elmer photolithographic device. This alignment system, called an autocollimator, includes viewing screen 30, beam splitter 31, beam expander 33, fold mirror 13 (see FIG. 1), focusing lens 35 and relay mirror 14 (see FIG. 1). Fold mirror 13 and relay mirror 14 are also elements in our illuminator system. Projection optics 36 are those found within a photolithographic device such as a Perkin-Elmer device.

In operation, beam 39 from helium/neon laser 32 passes to beam splitter 31, and then on path 40 to beam expander 33. Expander 33 emits expanded beam 41 which strikes fold mirror 13. A portion of beam 41 is reflected from the surface of fold mirror 13 to viewing screen 30, forming a reference spot thereon. The remainder of beam 41 passes through an opening in fold mirror 13 on path 42. With lens 35 out of the system, and a test mask at surface 38 in the path of light beam 42, light beam 42 is reflected from this test mask along a path though the opening in fold mirror 13, and back to viewing screen 30. By adjusting the test mask at surface 38 until the beam reflected therefrom coincides with the reference spot formed by light reflected from fold mirror 13, the test mask plane can be brought parallel with fold mirror 13. This adjustment insures that the focal plane of the arc image emerging from fiber-optic bundle 10 is parallel to the mask plane because the plane of this arc is parallel to fold mirror 3. This is the first step in aligning, accurately and precisely, the elements within our new illuminator system.

A second step for aligning the elements of our illuminator system requires placing lens 35 into the autocollimator system illustrated in FIG. 3. Lens 35 focuses beam 42 at the intersection of the test mask 38 and the optical axis of the illuminator system. The optical axis of the illuminator system also coincides with the center of curvature of relay mirror 14. By placing a means for diffusing light at the focus of lens 35, and by adjusting the position of relay mirror 14 until light passing from the diffusing means to the surface of relay mirror 14 returns to the diffusing means at the focal point of lens 35, the center of curvature of relay mirror 14 may be made coincident with the optical axis of the illuminator system.

The autocollimator system shown in FIG. 3 also permits aligning the illuminator system to the projection optics in a photolithographic device such as a Perkin-Elmer system. The first step in this process comprises bringing fold mirror 13 parallel with the actual mask plane in the photolithographic device. The method for achieving this result is the same method used for bringing the test mask plane into parallelism with fold mirror 13, as described above.

A second step in aligning the illuminator system to the projection optics of a photolithographic device using the autocollimator system illustrated in FIG. 3 comprises positioning the optical axis of the illuminator with the optical axis of the projection optics in the photolithographic device. This goal is attained by aligning the center of curvature of the secondary mirror in the projection optics of the photolithographic device with the focal point of lens 35.

Third, our autocollimator system can be used to focus the light emerging from lens 35 onto the actual mask plane 38 of the photolithographic device. This insures that the arc image is in focus on mask plane 38. In preferred embodiment, the relay mirror, fold mirror, fiber arc assembly and lens 35 are moved together along the optical axis until the proper focus is attained.

Fourth, the radius of the arc at mask plane 38 may be adjusted, as explained above, for optimum resolution.

Out autocollimator system has another important function. This system can be used to achieve the required separation between the centers of curvature of the primary and secondary mirrors in the projection optics of the photolithographic device, and to assure that the center of curvature of the primary mirror lies on the optical axis of our illuminator system. Our system attains both goals by focusing the light emerging from lens 35 at the centers of curvature of the primary and secondary mirrors in the photolithographic device.

What is claimed is:

1. A condenser system comprising means for homogenizing light with substantially no change in light cone angle, and substantially no absorption or reflection losses of light; means for channeling light emerging from said homogenizing means into an arc of light spots of substantially equal intensity, said arc having a predetermined radius, width and direction; means for magnifying the width of said arc, for reducing proportionately the cone angle of said arc in the direction of its width to produce circularly symmetric light distribution in the aperture of said condenser; and means for transferring the arc from the magnifying means to an image plane, for focusing the arc at the image plane, and for homogenizing the light along the length of the arc at the image plane.

2. The condenser of claim 1 wherein said means for homogenizing light comprises at least one light pipe.

3. The condenser of claim 2 wherein said light pipe is a solid quartz prism having a round, square or rectangular cross-section.

4. The condenser of claim 1 wherein said means for channeling light emerging from said homogenizing means comprises an array of fiber-optic fibers.

5. The condenser of claim 4 wherein the intensity distribution along the arc image is a function of spacing between the fiber ends.

6. The condenser of claim 1 wherein said means for magnifying the width of said arc of light spots comprises a toroidal lens with said channeling means joined thereto, said toroidal lens producing circularly symmetric illumination in the aperture.

7. The condenser of claim 1 wherein said means for transferring said arc of light spots to, and for focusing said arc of light spots at an image plane comprises a spherical relay mirror with its center of curvature in a plane normal to the optical axis of said spherical relay mirror such that the arc image forms at the tangential focus of said mirror and such that the sagittal focal plane of said mirror is displaced beyond the image of said arc a distance sufficient to homogenize said arc of light spots in the sagittal direction along the arc to produce a smooth distribution of light along the arc at an image plane.

8. The condenser of claim 1 further comprising a lamp/elliptical reflector combination for directing light to said homogenizing means wherein the wattage of said lamp is in the range of about 100 to about 500 watts.

9. A condenser comprising means for homogenizing light with substantially no change in light cone angle, and substantially no absorption or reflection losses, means for channeling light emerging from said homogenizing means into an arc of light spots, said arc having a predetermined intensity, radius, width and direction for producing circularly symmetric illumination in the aperture of said condenser; and means for transferring the circular-shaped arc of light spots to, and focusing said circular-shaped arc on an image plane with the light homogenized along the length of the arc, said condenser having an efficiency in the range of from about 20% to about 30%, said efficiency being defined as the ratio of the light in the spectral region of interest reaching the image plane divided by the light output of the lamp, an intensity distribution along the arc within about 2% of the desired distribution, and an arc radius adjustable in the range of about ±50 mils from a predetermined radius without refocusing.

10. The condenser of claim 1 further comprising means for accurately and precisely bringing said image plane into parallel with the mask plane of a photolithographic system.

11. The condenser system of claim 1 further comprising means for focusing said arc on the mask plane of a photolithograhic system.

12. The condenser system of claim 1 further comaprising means for aligning the optical axis of said condenser system with the optical axis of the projection optics in a photolithograhic system.

13. The condenser system of claim 1 further comprising means for accurately and precisely adjusting the spacing of centers of curvature of the primary and secondary mirrors in a photolithographic system comprising said primary and secondary mirrors, from one another.

14. A condenser system comprising means defining an aperture; means for channeling light into an arc of light spots of substantially equal intensity, said arc having a predetermined radius, width and direction; means for magnifying the width of said arc, and for reducing proportionately the cone angle of said arc in the direction of its width to produce circularly symmetric light distribution in the aperture of said condenser.

15. The condenser of claim 14 wherein said means for channeling light emerging from said homogenizing means comprises an array of fiber-optic fibers.

16. The condenser of claim 15 wherein the intensity distribution along the arc is a function of the spacing between the fiber ends.

17. The condenser of claim 14 wherein said means for magnifying the width of said arc of light spots comprises a toroidal lens with said channeling means joined thereto, said toroidal lens producing circularly symmetric illumination in the aperture.

18. The condenser system of claim 14 further comprising means for focusing said arc on a mask plane of a photolithographic system.

19. The condenser system of claim 14 further comprising means for aligning the optical axis of said condenser system with the optical axis of the projection optics in a photolithographic system.

20. The condenser system of claim 14 further comprising means for accurately and precisely adjusting the spacing of centers of curvature of the primary and secondary mirrors in a photolithographic system comprising said primary and secondary mirrors, from one another.

21. A condenser system comprising means defining an aperture; means for channeling light into an arc of light spots of substantially equal intensity, said arc having a predetermined radius, width and direction; means for magnifying the width of said arc, and for reducing proportionately the cone angle of said arc in the direction of its width to produce circularly symmetric light distribution in the apeture of said condenser; and means for transferring the arc in the magnifying means to an image plane, for focusing the arc at the image plane, and for homogenizing the light along the length of the arc at the image plane.

22. The condenser of claim 21 wherein said means for channeling light emerging from said homogenizing means comprises an array of fiber-optic fibers.

23. The condenser of claim 22 wherein the intensity distribution along the arc image is a function of the spacing between the fiber ends.

24. The condenser of claim 21 wherein said means for magnifying the width of said arc of light spots comprises a toroidal lens with said channeling means joined thereto, said toroidal lens producing circularly symmetric illumination in the aperture.

25. The condensor of claim 21 wherein said means for transferring said arc of light spots to, and for focusing said arc of light spots at an image plane comprises a spherical relay mirror with its center of curvature in a plane normal to the optical axis of said spherical relay mirror such that the arc image forms at the tangential focus of said mirror and such that the sagittal focal plane of said mirror is displaced beyong the image of said arc a distance sufficient to homogenize said arc of light spots in the sagittal direction along the arc to produce a smooth distribution of light along the arc at an image plane.

26. The condenser of claim 21 further comprising means for accurately and precisely bringing said arc into parallel with a mask plane of a photolithographic system.

27. The condenser system of claim 21 further comprising means for focusing said arc on a mask plane of a photolithographic system.

28. The condenser system of claim 21 further comprising means for aligning the optical axis of said condenser system with the optical axis of the projection optics in a photolithographic system.

29. The condenser system of claim 21 further comprising means for accurately and precisely adjusting the spacing of centers of curvature of the primary and secondary mirrors in a photolithographic system comprising said primary and secondary mirrors, from one another.

30. The condenser of claim 1 wherein said means for transferring said arc of light spots to, and for focusing said arc of light spots at an image plane comprises a spherical relay mirror with its center of curvature in a plane normal to the optical axis of said spherical relay mirror such that the arc image forms at the tangential focus of said mirror and such that the sagittal focal plane of said mirror is displaced beyong the image of said arc a distance sufficient to homogenize said arc of light spots in the sagittal direction along the arc to produce a smooth distribution of light along the arc at an image plane.

31. A mirror projection aligner including a condenser system comprising means defining an aperature; means for channeling light into an arc of light spots of substantially equal intensity, said arc having a predetermined radius, width and direction; and means for magnifying the width of said arc, and for reducing proportionately the cone angle of said arc in the direction of its width to produce circularly symmetric light distribution in the aperture of said condenser.

32. The condenser of claim 31 wherein said means for channeling light emerging from said homogenizing means comprises an array of fiber-optic fibers.

33. The condenser of claim 32 wherein the intensity distribution along the arc image is a function of the spacing between the fiber ends.

34. The condenser of claim 31 wherein said means for magnifying the width of said arc of light spots comprises a toroidal lens with said channeling means joined thereto, said toriodal lens producing circularly symmetric illumination in the apeture.

35. The condenser system of claim 31 further comprising means for focusing said arc on a mask plane of a photolithogrpaphic system.

36. The condenser system of claim 31 further comprising means for aligning the optical axis of said condenser system with the optical axis of the projection optics in a photolithographic system.

37. The condenser system of claim 31 further comprising means for accurately and precisely adjusting the spacing of centers of curvature of the primary and secondary mirrors in a photolithographic system comprising said primary and secondary mirrors, from one another.

38. A mirror projection aligner including a condenser system comprising means defining an aperature; means for channeling light into an arc of light spots of substantially equal intensity, said arc having a predetermined radius, width and direction; means for magnifying the width of said arc, and for reducing proportionately the cone angle of said arc in the direction of its width to produce circularly symmetric light distribution in the aperture of said condenser; and means for transferring the arc from the magnifying means to an image plane, for focusing the arc at the image plane, and for homogenizing the light along the length of the arc at the image plane.

39. The condenser of claim 38 wherein said means for channeling light emerging from said homogenizing means comprises an array of fiber-optic fibers.

40. The condenser of claim 39 wherein the intensity distribution along the arc image is a function of the spacing between the fiber ends.

41. The condenser of claim 38 wherein said means for magnifying the width of said arc of light spots comprises a toroidal lens with said channeling means joined thereto, said toroidal lens producing circularly symmetric illumination in the aperture.

42. The condenser of claim 38 further comprising means for accurately and precisely bringing said arc into parallel with a mask plane of a photolithographic system.

43. The condenser system of claim 38 further comprising means for focusing said arc on a mask plane of a photolithographic system.

44. The condenser system of claim 38 further comprising means for aligning the optical axis of said condenser system with the optical axis of the projection optics in a photolithographic system.

45. The condenser system of claim 38 further comprising means for accurately and precisely adjusting the spacing of centers of curvature of the primary and secondary mirrors in a photolithgraphic system comprising said primary and secondary mirrors, from one another.

* * * * *